United States Patent [19]
Itoh et al.

[11] Patent Number: 5,212,446
[45] Date of Patent: May 18, 1993

[54] MAGNETO-OPTICAL ELEMENT AND MAGNETIC FIELD MEASUREMENT APPARATUS

[75] Inventors: Nobuki Itoh, Hirakata; Hirokazu Yamada, Sakai, both of Japan

[73] Assignee: Matsushita Electric Industrial Co., Ltd., Osaka, Japan

[21] Appl. No.: 873,211

[22] Filed: Apr. 24, 1992

[30] Foreign Application Priority Data

Apr. 25, 1991 [JP] Japan .................................. 3-095812

[51] Int. Cl.$^5$ .................. G01R 33/02; G02B 5/30; G02F 1/29; G02F 1/31
[52] U.S. Cl. .................. 324/244.1; 359/280; 250/227.14
[58] Field of Search ............. 324/244.1, 96; 250/227.14; 359/280, 281, 283, 321

[56] References Cited
U.S. PATENT DOCUMENTS 5,075,546 12/1991 Kamada et al. .

OTHER PUBLICATIONS

K. Kyuma et al., *IEEE Journal of Quantum Electronics*, QE-18(10) 1619 (1982).

*Primary Examiner*—Walter E. Snow
*Attorney, Agent, or Firm*—Wenderoth, Lind & Ponack

[57] ABSTRACT

The present invention relates to a magneto-optical element which is made of a bismuth-substituted rare earth iron garnet crystal of a formula $$(Bi_X Gd_Y R_Z Y_{3-X-Y-Z})(Fe_{5-W} Ga_W)O_{12},$$

wherein R designates an element selected among rare earth elements, wherein $0.8 \leq X \leq 1.3$, $0.1 \leq Y \leq 0.3$, $0.1 \leq Z \leq 1.0$ and $0.3 \leq W \leq 0.8$. The magneto-optical element has a constant sensitivity less than $\pm 4.0\%$ between $-50°$ and $+100°$ C. around room temperature. Further, a magnetic field measurement apparatus comprises the magneto-optical element and a light source of a central wavelength in the 0.8 μm band. A magnetic field measurement apparatus with use of the magneto-optical element is stable against temperature change for practical use.

11 Claims, 7 Drawing Sheets

MAGNETO-OPTICAL ELEMENT AND MAGNETIC FIELD MEASUREMENT APPARATUS

BACKGROUND OF THE INVENTION

1. Field of the Invention

The present invention relates to a magneto-optical element which makes use of the Faraday effect and to a magnetic field measurement apparatus for detecting and measuring a magnetic field intensity with use of the magneto-optical element.

2. Description of the Prior Art

Recently, a magnetic field measurement apparatus which combines a magneto-optical element of the Faraday effect with optical fibers is proposed in order to measure a magnetic field intensity optically (K. Kyuma et al., IEEE Journal of Quantum Electronics, Vol. QE-18 No. 10, 1619 (1982)).

In such a magnetic field measurement apparatus as mentioned above, an electrical current is detected by measuring the magnetic field intensity generated around an electrical conductor through which the electrical current flows. This method has a characteristic that electromagnetic induction noises are not detected or electrical insulation is good because light is used for transmission. Therefore, the method is applicable to a transmission and distribution equipment of electric power.

FIG. 1 shows a principle of a method of measuring a magnetic field by using the Faraday effect. In FIG. 1, a magneto-optical element 1 is placed in a magnetic field H. A light which has been polarized linearly by a polarizer 2 is transmitted through the magneto-optical element. The polarization plane is subjected to rotation in proportion to the magnetic field intensity H according to the Faraday effect. The linearly polarized light which has been subjected to rotation transmits an analyzer 3 which is arranged to change the polarization direction of transmitted polarized light by 45°, and the magnitude of the Faraday rotation angle $\Theta$ is converted to a change in light intensity. The optical output $P_{out}$ in this measurement is given by the following Equations (1) and (2):

$$P_{out} = K(1 + \sin 2\Theta), \quad (1)$$

and $$\Theta = CHL, \quad (2)$$

wherein K is a proportional constant, L is a length (cm) of a crystal of the magneto-optical element 1 (refer FIG. 1), the Faraday rotation angle $\Theta$ is expressed in unit of degree and C is a sensitivity constant in unit of degree/cm·Oe which expresses the sensitivity of the magneto-optical element 1.

It is proposed to arrange a plurality of magnetic field measurement apparatus with use of the above-mentioned principle at points along a transmission and distribution line to send their electrical outputs of the apparatuses to a computer wherein for example the zero phase current in the transmission and distribution line is detected with use of a reference signal obtained by adding or subtracting the waveforms of the electrical outputs and the occurrence of accidents in the transmission and distribution line is judged.

As a magneto-optical sensor which can be used in such a magnetic field measurement element, a rare earth iron garnet crystal is disclosed which can be expressed by a following chemical formula (3), wherein $1.0 \leq X \leq 1.4$ and $0.1 \leq Y \leq 0.7$ (U.S. Pat. No. 5,075,546):

$$Bi_X Gd_Y Y_{3-(X+Y)} Fe_5 O_{12}. \quad (3)$$

In the prior art rare earth iron garnet crystal, yttrium is substituted partially by bismuth in order to increase the Faraday rotation angle $\Theta$ or the sensitivity C, while yttrium is substituted partially by gadolinium in order to improve the temperature characteristics. As shown in FIG. 2, the temperature change in sensitivity constant C of the prior art crystals is within ±2.5% in a temperature range between −20° C. and +80° C.

However, a magnetic field measurement apparatus constructed with use of the prior art magneto-optic element has problems practically on the temperature characteristics, the sensitivity and the precision of measurement. At present, no magneto-optical element of bismuth substituted rare earth iron garnet crystal can be used practically for a magnetic field measuring apparatus due to bad temperature characteristics. Further, if a light source of 0.8 μm band is used for a prior art bismuth substituted rare earth iron garnet crystal, the output light intensity of the magnetic measurement apparatus becomes small due to the loss of optical absorption in a crystal, and the SN ratio decreases to worsen the precision.

Therefore, if a magneto-optical element which has a smaller loss of optical absorption than the prior art bismuth substitution rare earth iron garnet crystal is provided, the SN ratio can be improved and the measurement precision can be improved. Further, if a short wavelength light source of 0.8 μm band is used, the Faraday rotation angle $\Theta$ becomes larger than in case of 1.3 μm band, so that the sensitivity constant C of the crystal increases. If the sensitivity constant C increases, the thickness of an element to be used can be decreased, and the time required for crystal growth can be shortened with use of a liquid phase epitaxy technique or a gas phase crystal growth technique.

SUMMARY OF THE INVENTION

The present invention has been developed with a view to substantially solving the above-mentioned problems and has for its object to provide a bismuth substituted rare earth iron garnet crystal which has no problem as to a temperature change around room temperature, has a large sensitivity constant and has a small light absorption loss in 0.8 μm band, and to provide a magnetic field measurement apparatus wherein the bismuth substituted rare earth iron garnet crystal is used as a magneto-optical element.

The present invention solves the above-mentioned problems and provide a magneto-optical element made of a bismuth-substituted rare earth iron garnet of a chemical formula $$(Bi_X Gd_Y R_Z Y_{3-X-Y-Z})(Fe_{5-W} Ga_W)O_{12}, \quad (4)$$

wherein R designates an element selected among rare earth elements, $0.8 \leq X \leq 1.3$, $0.1 \leq Y \leq 0.3$, $0.1 \leq Z \leq 1.0$ and $0.3 \leq W \leq 0.8$.

Further, the present invention provide a magnetic field measurement apparatus for detecting a change in magnetic field intensity wherein a magneto-optical transducer with use of the magneto-optical element is provided.

An advantage of the present invention is that the magneto-optical element has a temperature change of the sensitivity constant less than ±4.0% in a temperature range between −50° and +100° C. and that the magnetic field measurement apparatus with use of the magneto-optical element is stable in the temperature range for practical use.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

An embodiment of the present invention will be explained below with reference to drawings.

Bismuth substituted rare earth iron garnet crystal of a chemical formula

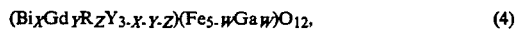

$$(Bi_X Gd_Y R_Z Y_{3-X-Y-Z})(Fe_{5-W} Ga_W)O_{12}, \quad (4)$$

wherein R designates an element selected among rare earth elements, are grown on a Ca—Mg—Zr substituted $Gd_3Ga_5O_{12}$ single crystal substrate with a liquid phase epitaxy technique with use of $Bi_2O_3$-PbO-$B_2O_3$ flux. Table 1 shows examples, wherein the numerical values represent the composition ratios X, Y, Z and W for each element. The temperature change of sensitivity constant C (Eq. (2)) of a crystal is measured for the prepared samples in a temperature range between −50°−+100° C. which is wider than an ordinary temperature range between −20°−+80° C. The results are compiled to show temperature characteristics. The samples for which a # mark is added in the column of the temperature change in sensitivity constant are outside the scope of the present invention.

In order to decrease the temperature change of sensitivity constant C and the loss of optical absorption of bismuth substituted rare earth iron garnet crystals especially when a 0.85 μm light source is used, iron is substituted partially with gallium. On the other hand, the substitution amount X, Y of bismuth and gadolinium for yttrium is controlled against the substitution amount W of iron with gallium. Further, in order to improve the lattice matching of the single crystal films grown on a substrate, yttrium is substituted with lanthanum which has an ionic radius closest to that of bismuth. Thus, a magneto-optical element of better crystallinity for magnetic field measurement apparatus can be obtained.

Though lanthanum is used as an element R for crystal matching in the Examples, one or more of rare earth elements can be used as an element R in the chemical formula. In such substitution, it is better that the substitution element is a nonmagnetic element which has no effect on the saturation magnetization of bismuth substituted rare earth iron garnet crystal.

Further, when a substrate of the lattice constant different from that of Ca—Mg—Zr substituted $Gd_3Ga_5O_{12}$ crystal substrate is used, a bismuth substituted rare earth iron garnet crystal of good temperature characteristic can be grown by substituting with one or more of rare earth elements as R in the chemical formula (4) for crystal matching.

Figure 1:
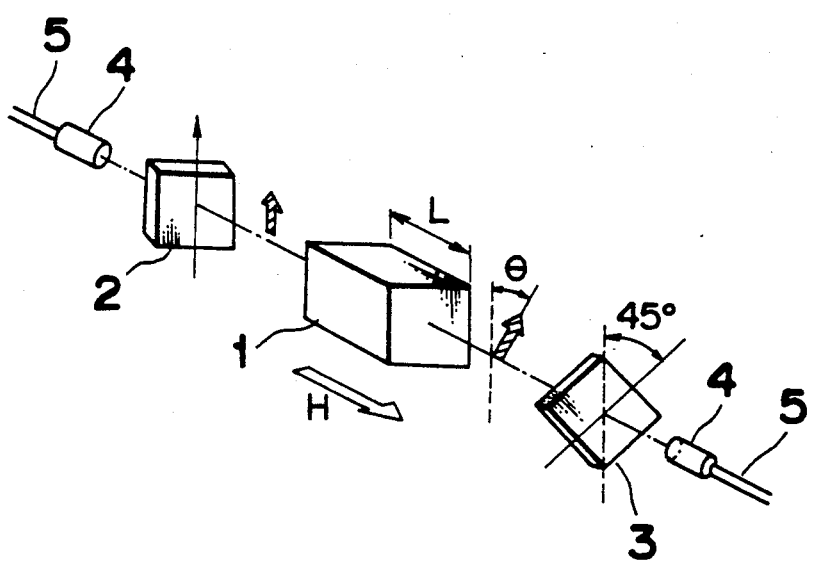
FIG. 1 is a diagram for showing the principle of magnetic field measurement with use of the Faraday effect.
Figure 2:
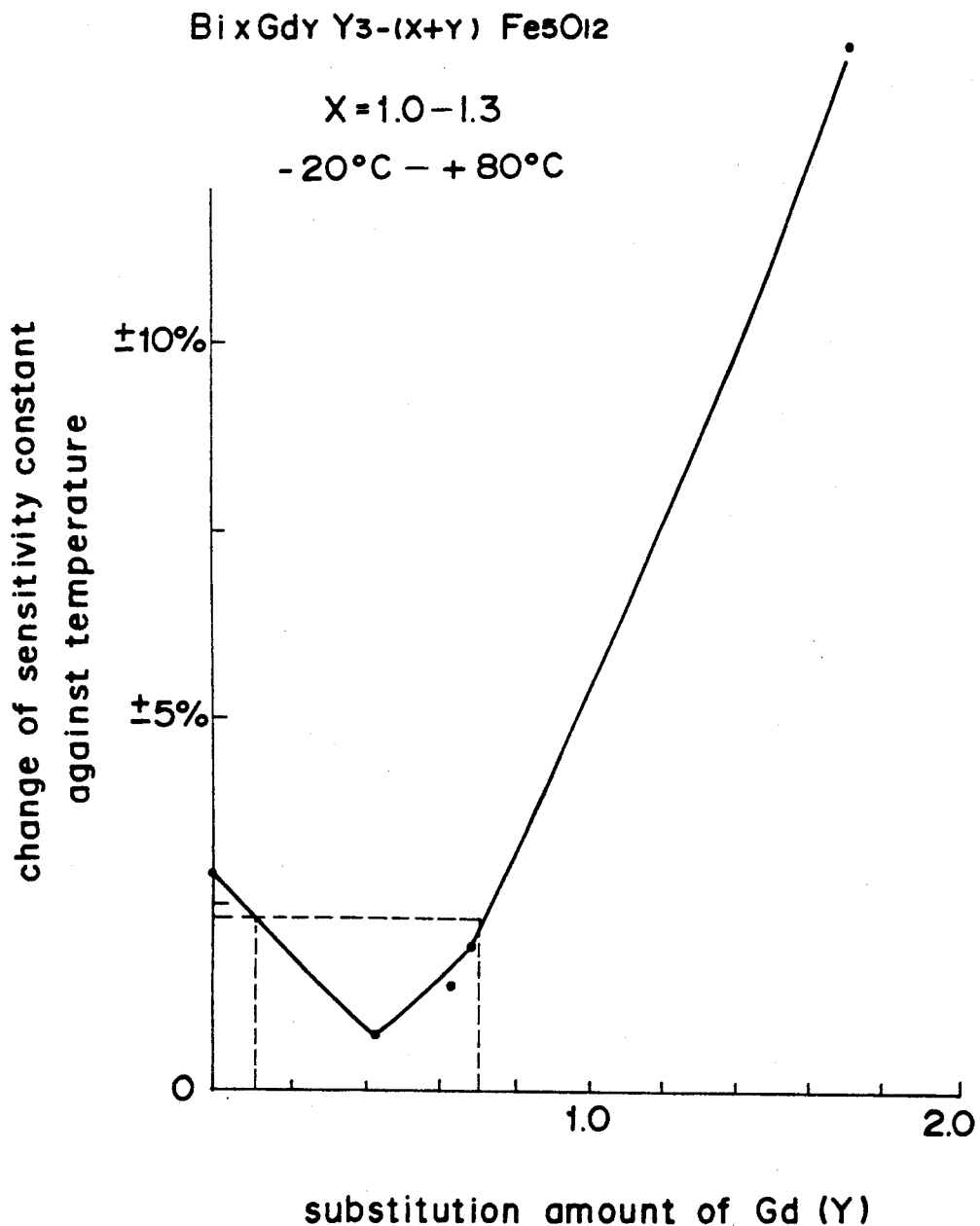
FIG. 2 is a graph of temperature change of sensitivity constant of prior art (BiGdY)IG crystals.
Figure 3:
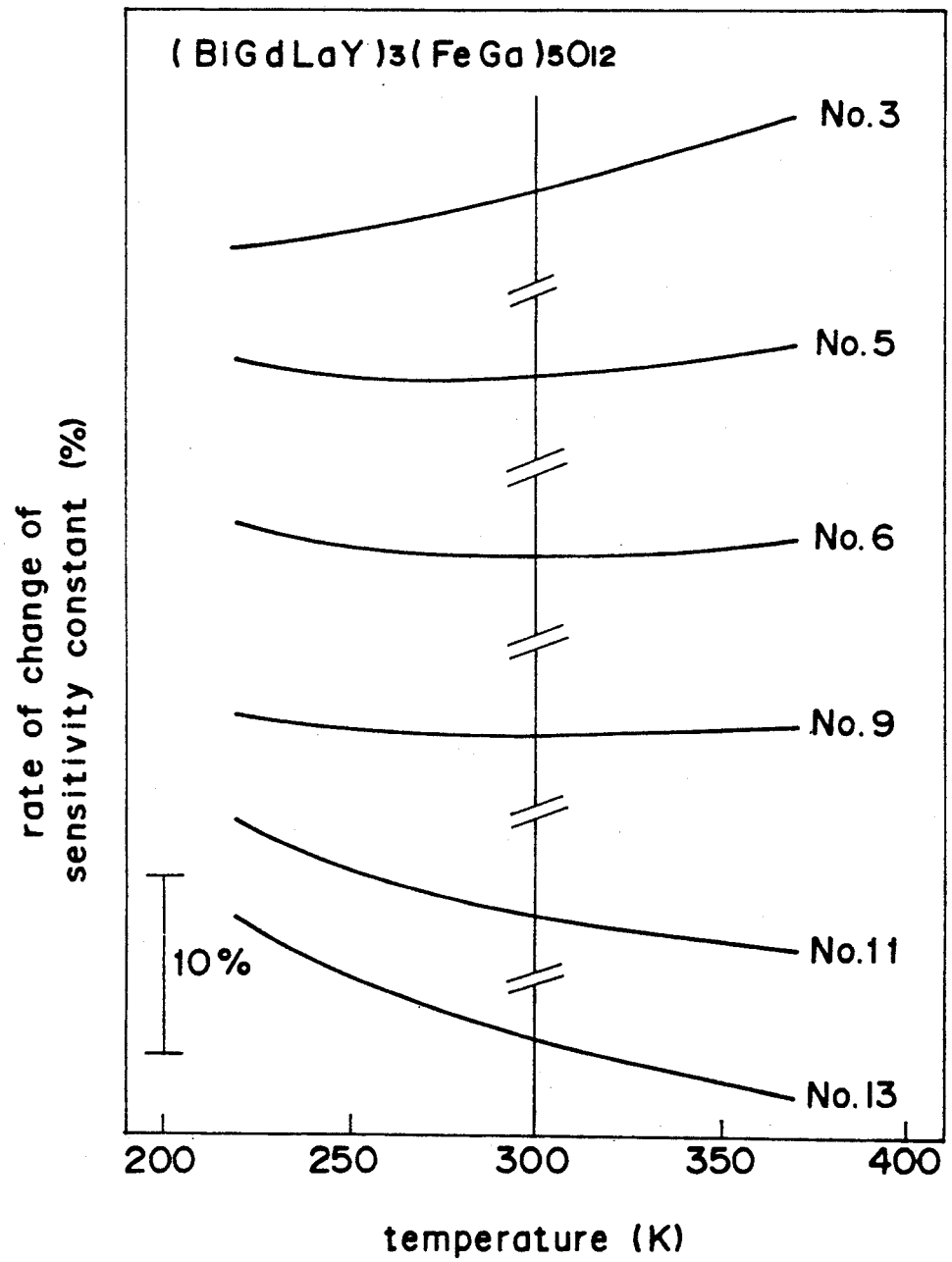
FIG. 3 is a graph of temperature change of sensitivity constant of magneto-optical elements according to the present invention.

FIG. 3 displays data on temperature change measured with use of 0.85 μm light source for samples designated with marks * in Table 1, wherein the data is normalized with the sensitivity constant at room temperature.

Figure 4:
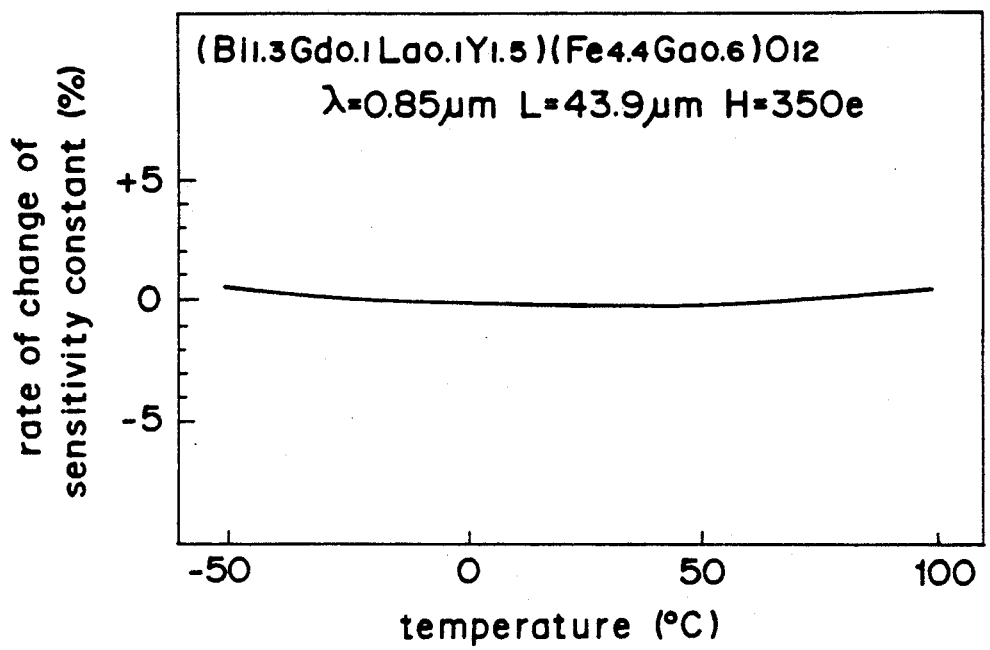
FIG. 4 is a graph of temperature change of sensitivity constant of a magneto-optical element which has the smallest temperature change of sensitivity constant among magneto-optical elements.

Among the samples, No. 9 sample (refer Table 1) of $(Bi_{1.3}Gd_{0.1}R_{0.1}Y_{1.5})(Fe_{4.4}Ga_{0.6})O_{12}$ has the best temperature characteristic of temperature change of ±0.4%, as shown in FIG. 4, which is not realized previously.

TABLE 1

| | Composition of rare earth iron garnet crystal samples | | | | | | |
|---|---|---|---|---|---|---|---|
| sample No. | Bi (X) | Gd (Y) | La (Z) | Y (3-X-Y-Z) | Fe (5-W) | Ga (W) | temperature change of sensitivity constant C |
| 1 | 0.5 | — | 1.1 | 1.4 | 4.3 | 0.7 | # ±4.5% |
| 2 | 0.6 | — | 1.1 | 1.3 | 4.6 | 0.4 | # ±4.3% |
| * 3 | 0.6 | — | 1.1 | 1.3 | 4.3 | 0.7 | # ±4.0% |
| 4 | 0.8 | 0.2 | 0.9 | 1.1 | 4.7 | 0.3 | ±1.2% |
| * 5 | 0.8 | 0.2 | 0.9 | 1.1 | 4.5 | 0.5 | ±1.0% |
| * 6 | 0.8 | 0.2 | 0.9 | 1.1 | 4.3 | 0.7 | ±0.8% |
| 7 | 1.0 | 0.2 | 0.8 | 1.0 | 4.4 | 0.6 | ±0.7% |
| 8 | 1.3 | 0.1 | 0.1 | 1.5 | 4.5 | 0.5 | ±0.6% |
| * 9 | 1.3 | 0.1 | 0.1 | 1.5 | 4.4 | 0.6 | ±0.4% |
| 10 | 1.3 | 0.1 | 0.1 | 1.5 | 4.2 | 0.8 | ±0.6% |
| * 11 | 0.8 | 0.3 | 1.0 | 0.9 | 4.3 | 0.7 | ±3.5% |
| 12 | 0.8 | 0.4 | 0.9 | 0.9 | 4.3 | 0.7 | # ±4.0% |
| * 13 | 0.8 | 0.5 | 0.9 | 0.8 | 4.3 | 0.7 | # ±4.5% |

A bismuth substituted rare earth iron garnet for a magneto-optical element according to the present invention is represented by the above-mentioned chemical formula,

$$(Bi_X Gd_Y R_Z Y_{3-X-Y-Z})(Fe_{5-W} Ga_W)O_{12}, \quad (4)$$

wherein R designates an element selected among the rare earth elements and lanthanum is used in the embodiment as displayed in Table 1. A crystal according to the present invention has the temperature change of sensitivity constant C less than ±4% in a temperature range between $-50°$ and $+100°$ C. As shown in the data of the samples without # mark compiled in Table 1, it is preferable that the composition designated by X, Y, Z and W satisfy the following relations: $0.8 \leq X \leq 1.3$, $0.1 \leq Y \leq 0.3$, $0.1 \leq Z \leq 1.0$ and $0.3 \leq W \leq 0.8$. Further, it is more preferable that the temperature change of sensitivity constant C is less than $\pm 1.2\%$ in a temperature range between $-50°$ and $+100°$ C. Therefore, it is more preferable that the composition designated by X, Y, Z and W satisfy the following relations: $0.8 \leq X \leq 1.3$, $0.1 \leq Y \leq 0.2$, $0.1 \leq Z \leq 0.9$ and $0.3 \leq W \leq 0.8$. Further, it is still more preferable that the temperature change of sensitivity constant C is less than $\pm 0.6$ in a temperature range between $-50°$ and $+100°$ C. Therefore, it is still more preferable that the composition designated by X, Y, Z and W satisfy the following relations: $X=1.3$, $Y=\leq 0.1$, $Z=0.1$ and $0.5 \leq W \leq 0.8$. The best composition is $(Bi_{1.3}Gd_{0.1}R_{0.1}Y_{1.5})(Fe_{4.4}Ga_{0.6})O_{12}$ (No. 9 sample).

Figure 5:
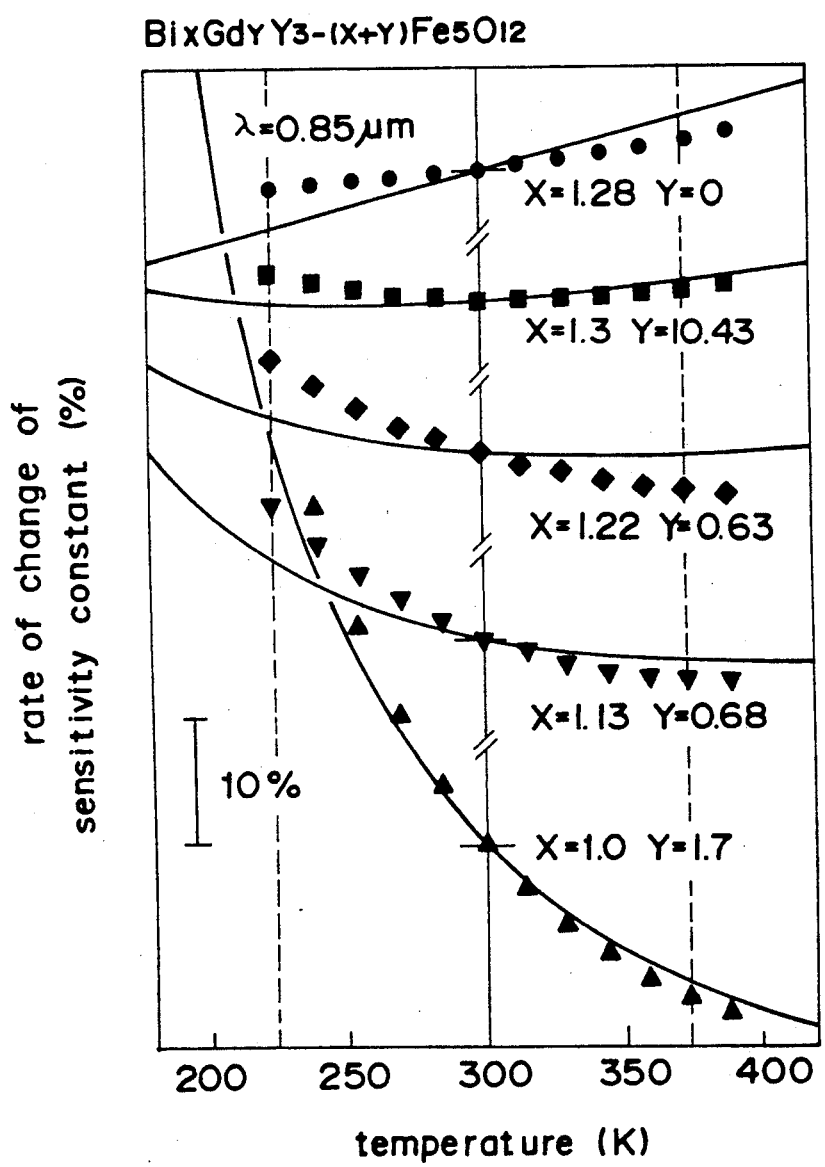
FIG. 5 is a graph of comparison data on the temperature change of sensitivity constant of prior art (BiGdY)IG crystals plotted against Gd substitution amount.
Figure 6:
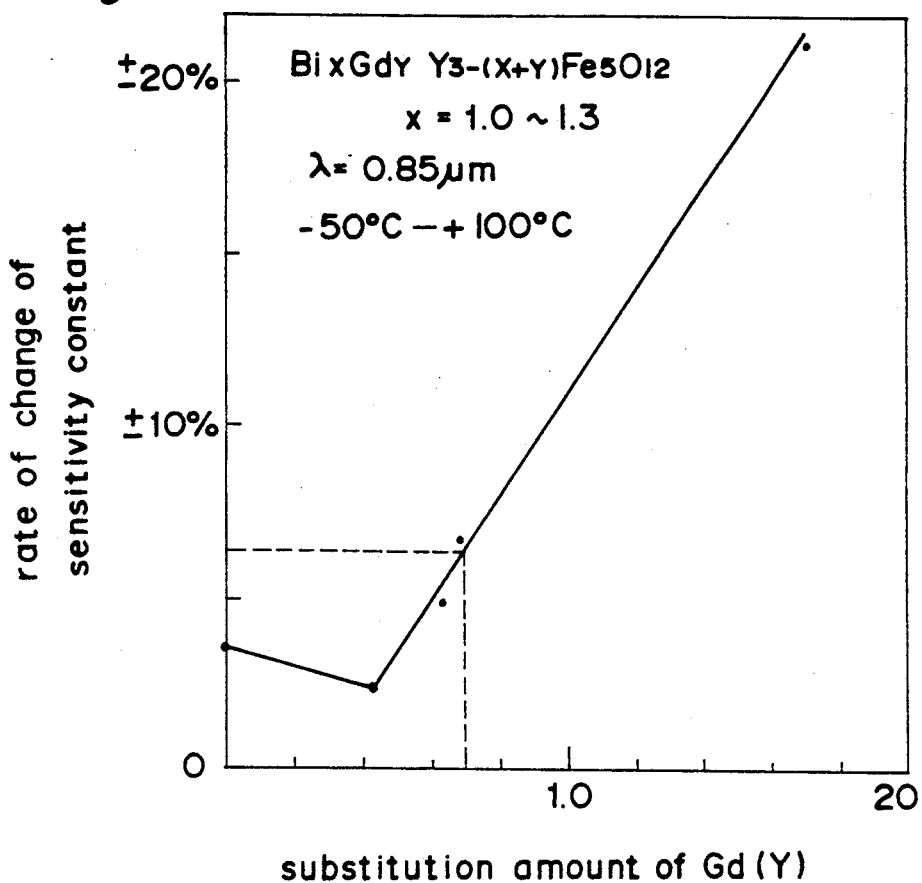
FIG. 6 is a graph of comparison data on the temperature change of sensitivity constant of prior art (BiGdY)IG crystal plotted against Gd substitution amount.
Figure 7:
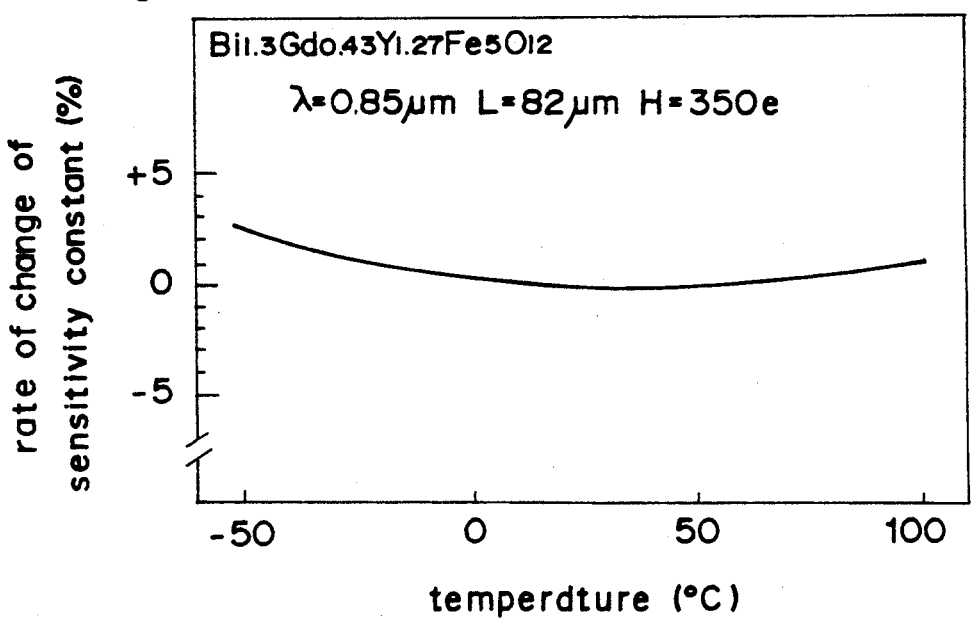
FIG. 7 is a graph of comparison data on the temperature change of sensitivity constant of a bismuth substituted rare earth iron garnet crystal which has the smallest temperature change of sensitivity constant among prior art (BiGdY)IG crystals.

For comparison, FIG. 5 shows data on temperature change measured with use of 0.85 μm light source for prior art samples of $Bi_XGd_YY_{3-(X+Y)}Fe_5O_{12}$ (3) wherein $1.0 \leq X \leq 1.4$, $0.1 \leq Y \leq 0.7$. FIG. 6 displays the temperature change of sensitivity constant against Gd substitution amount obtained from the data of FIG. 5. As shown in FIG. 6, the temperature change of sensitivity constant of the prior art crystals is $\pm 7.0\%$ or less in a temperature range between $-50°$ and $+100°$ C. On the contrary, the temperature range to be used practically is broaden by $50°$ C. for a magneto-optical element of the present invention compared with that of the prior art element. That is, the temperature change of magneto-optical element of the present invention becomes more flat. That is, the temperature characteristics of the best data are improved largely from $\pm 1.0\%$ or less to less than $\pm 0.4\%$ in the temperature range between $-50°$ and $+100°$ C. if compared with the best prior art data of FIG. 7, and the sensitivity constant C of the best crystal nearly changes against the temperature in the temperature range.

The improvement is found not only for a 0.85 μm light source but also for a light source of other wavelengths which transmits a garnet crystal.

Further, though the above-mentioned data relate to crystals grown on a Ca—Mg—Zr substituted $Gd_3Ga_5O_{12}$ substrate, similar results are obtained for crystals grown on a $Nd_3Ga_5O_{12}$ substrate in various crystal growth conditions.

Further, it is possible to grow a crystal epitaxially on the substrates with a gas phase crystal growth technique.

In any of the above-mentioned crystal growth techniques, in some conditions, a magneto-optical element made of a bismuth-substituted rare earth iron garnet crystal of the chemical formula (4) of $0.8 \leq X \leq 1.3$, $0.1 \leq Y \leq 0.3$, $0.1 \leq Z \leq 1.0$ and $0.3 \leq W \leq 0.8$ may not be grown epitaxially, and a polycrystalline or a sintered sample is grown. Even such a polycrystalline or sintered magneto-optical element can be used practically though the optical absorption loss increases a little.

Figure 8:
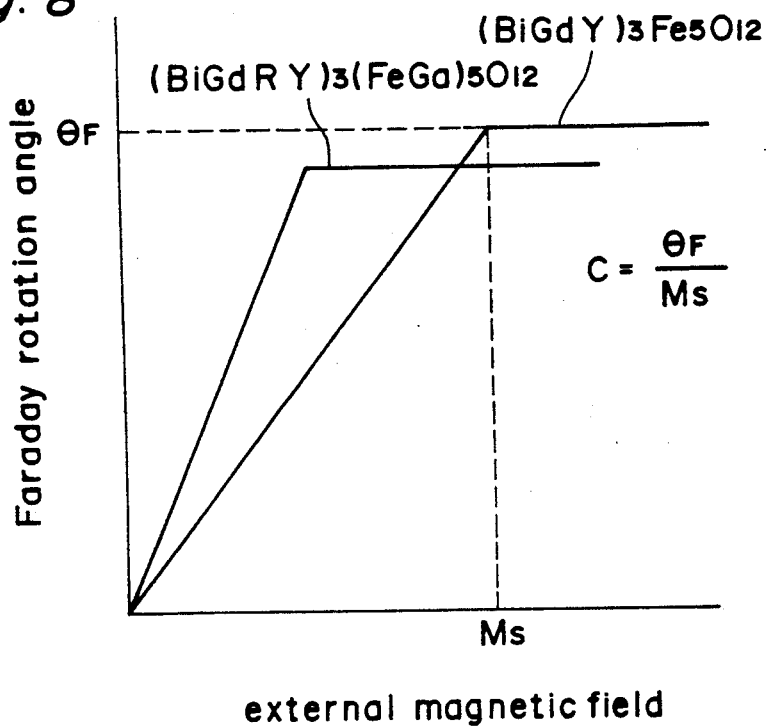
FIG. 8 is a diagram for illustrating the Faraday effect of bismuth substituted rare earth iron garnet crystals.

A basic theory for obtaining good temperature characteristics are as follows: An rare earth iron garnet is a ferrimagnet, and the Faraday effect saturates at a certain magnetic field, as shown in FIG. 8. As to magnetic field measurement, a part which changes linearly against external magnetic field is used. In this case, the rotation angle Θ is expressed by the following Equation (5):

$$\Theta = \Theta_F(H/M_S)L, \quad (5)$$

wherein $\Theta_F$ is saturation Faraday rotation, $M_S$ is the saturation magnetization and L is a crystal length. Therefore, the sensitivity constant C and its temperature dependence is defined by the following Equation (6):

$$C(T) = \Theta_F(T)/M_S(T). \quad (6)$$

As shown in Eq. (6), the temperature change of sensitivity constant C is determined by the temperature changes of $\Theta_F$ and $M_S$.

The rate of temperature change of $M_S(T)$ agrees more with $\Theta_F(T)$ for a rare earth iron garnet crystal according to the present invention, wherein gallium is used for substitution of iron and the substitution amounts X, Y of bismuth and gadolinium of yttrium are controlled.

To sum up, the Faraday rotation angle Θ of a bismuth substitution rare earth iron garnet becomes larger by about one digit if compared with a prior art rare earth iron garnet without bismuth substitution. Therefore, the sensitivity of magneto-optical element can be increased by substituting yttrium with bismuth as much as possible. Further, by substituting yttrium with gadolinium, temperature compensation due to the substitution of yttrium with bismuth is performed in order to improve the temperature characteristics. On the other hand, iron is substituted with gallium in order to decrease the optical absorption loss of the crystal in the 0.8 μm band. On the contrary, in a prior art rare earth iron garnet crystal $Bi_XGd_YY_{3-(X+Y)}Fe_5O_{12}$ (3), iron is not substituted with gallium. Therefore, the temperature change of sensitivity constant C becomes more constant for the present invention and the temperature characteristic is improved. Still further, yttrium is substituted with at least one rare earth element in order to improve the crystal matching against a substrate. Thus, the composition of each element is controlled to have good temperature characteristics.

Next, Table 2 shows the data on the absorption coefficient and on the sensitivity constant of rare earth iron garnet crystals as well as those of prior art crystals, wherein K is absorption coefficient.

TABLE 2

|  |  | $\lambda = 0.8$ μm band | $\lambda = 1.3$ μm band |
|---|---|---|---|
| prior art | (BiGY) IG | K K250 cm$^{-1}$<br>C = 5.0<br>deg/cm · Oe | K = 2.5 cm$^{-1}$<br>C = 1.4<br>deg/cm · Oe |
| this invention | (BiGdLaY) (FeGa) G | K = 200 cm$^{-1}$<br>C = 11.0<br>deg/cm · Oe | K = 2.5 cm$^{-1}$<br>C = 2.4<br>deg/cm · Oe |

The data of Table 2 shows that the absorption coefficient K especially in 0.8 μm band becomes small by the gallium substitution and that the sensitivity constant C increases according to Eq. (6) because the saturation magnetization $M_S$ decreases due to the substitution of iron with nonmagnetic ion.

In a prior art rare earth iron garnet crystal of chemical formula (3) wherein iron is not substituted with gallium, about 100 μm is necessary in order to use it for a magneto-optical element. On the contrary, the film thickness can be decreased to about a half for a magneto-optical element of the present invention, and the growth time can be shortened and the productivity of crystal can be improved.

Further, the optical absorption loss as a magneto-optical element is decreased because the film thickness is decreased. In a prior art rare earth iron garnet crystal of chemical formula (3) wherein iron is not substituted with gallium, the output light intensity is small and the measurement precision is bad when a light source of 0.8 $\mu$m band is used. On the contrary, the SN ratio increases and the precision of measurement is improved for a magnetic field measurement apparatus with use of a magneto-optical element according to the present invention. Further, a light-emitting element and a photosensitive element of short wave 0.8 $\mu$m band can be used which can be manufactured at a lower cost than those of longer wavelength 1.3 $\mu$m band, and a magnetic field measurement apparatus can be provided at a lower cost.

Figure 9:
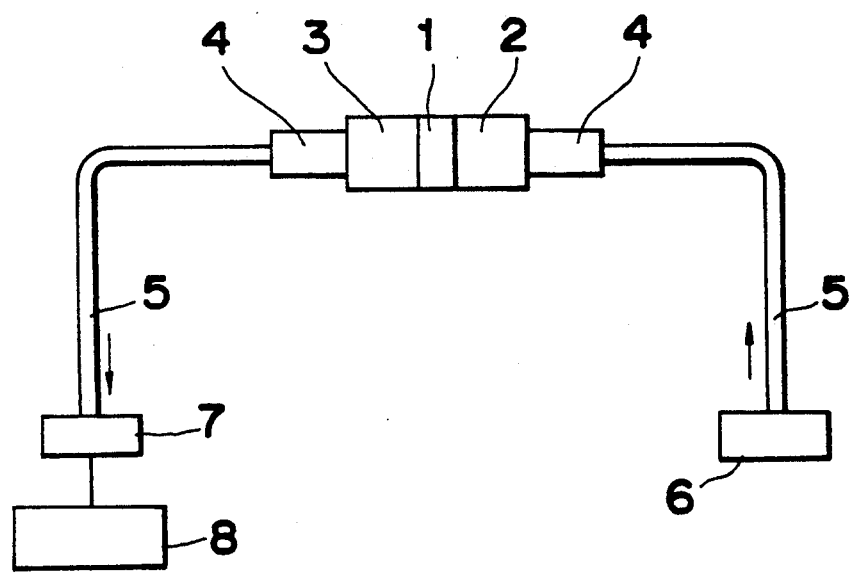
FIG. 9 is a schematic diagram of an embodiment of a magnetic field measurement apparatus with use of a magneto-optical element according to the present invention.

FIG. 9 shows an embodiment of magnetic field measurement apparatus with use of a magneto-optical element mentioned above. A magneto-optical element 1 is a No. 9 sample of $(Bi_{1.3}Gd_{0.1}R_{0.1}Y_{1.5})(Fe_{4.4}Ga_{0.6})O_{12}$ (refer Table 1) of thickness 43.9 $\mu$m. The numerical number 2 designates a polarizer provided near an end face of the magneto-optical element 2. The numerical number 3 designates a analyzer provided near another end face of the magneto-optical element so as to make the polarization direction of transmitted light tilted by 45° against the polarizer 2. The polarizer 2 and the analyzer 3 ar made of a polarization plate of glass for a making their sizes small. A magneto-optical transducer composed of the magneto-optical element 1, the polarizer 2 and the analyzer 3 is arranged in a magnetic field (H) to be measured or in a gap of metallic core which is used to intensify the measurement magnetic field. Especially, the magneto-optical transducer including the polarizer 2 and the analyzer 3 made of glass has a compact size, so that the gap of the metallic core can be narrowed. Then, the sensitivity of the magnetic field measurement apparatus can be improved. The reference numeral 4 designates a lens which makes an incident light to the magneto-optical transducer or a transmission light from the magneto-optical transducer collimate. That is, the lens 4 provides a collimated light. The reference numeral 5 designates an optical fiber which forms an optical transmission line. The reference numeral 6 designates an optical signal generator, which is made of a light emitting diode or a laser diode of 0.8 $\mu$m band or of 1.3 $\mu$m band.

Figure 10:
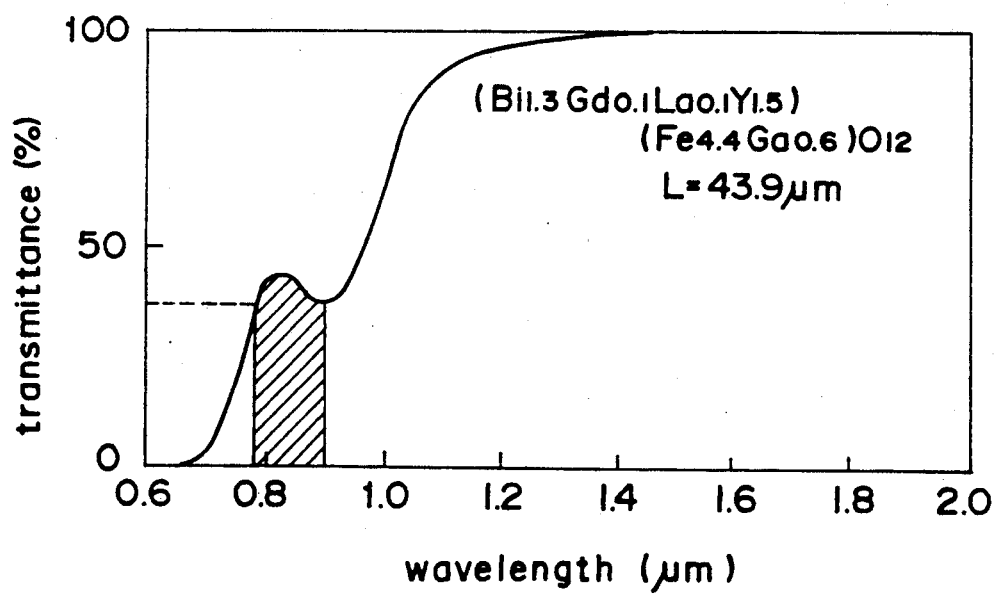
FIG. 10 is a graph of transmission spectra of a magneto-optical element according to the present invention.

FIG. 10 displays a graph of optical transmission spectra of No. 9 sample of $(Bi_{1.3}Gd_{0.1}R_{0.1}Y_{1.5})(Fe_{4.4}Ga_{0.6})O_{12}$. If a bismuth substituted rare earth iron garnet crystal according to the present invention is used for a magnetic field measurement apparatus as shown in FIG. 10, the transmission rate is required to be 35.0% or more. If a light source of central wavelength of 0.8 $\mu$m band is used, the Faraday rotation angle $\Theta$ increases four times compared in case of a light source of 1.3 $\mu$m band. Therefore, it is found necessary that a light source of central wavelength of 0.78 to 0.90 $\mu$m, as displayed in FIG. 10 as a hatched area, is necessary for a magnetic field measurement apparatus. Then, in this embodiment, a light emitting diode of peak wavelength of $\mu = 0.85$ $\mu$m is used. The reference numeral 7 designates a detection means for detecting light after the transmission of the element 1 to convert to an electrical signal, such as Ge photodiode, Si PIN photodiode or the like. In this embodiment, a Si PIN photodiode is used because a light emitting diode of 0.85 $\mu$m. The reference numeral 8 designates a signal processor. If magnetic field is measured with this apparatus, magnetic field of 120 Oe or less is measured in a temperature range between $-50°$ and $+100°$ C. at a high precision of a change of measurement sensitivity of $\pm 0.5\%$ or less which is never realized previously. It is also possible to use the polarizer 2 and the analyzer 3 of Gran-Thompson prism or of polarized beam splitter instead of glass polarization plate.

As explained above, magnetic field intensity can be measured in a wider temperature range never realized before, without affected by temperature range around room temperature, with a good sensitivity and with a high precision, with use of a magneto-optical element and a magnetic field measurement apparatus with use of the present invention according to the present invention. Such an element and an apparatus can be manufactured at a low cost, and this is valuable for a practical use.

Though the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A magneto-optical element made of a bismuth-substitution rare earth iron garnet crystal of a chemical formula

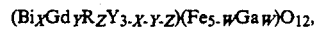

wherein R designates an element selected among rare earth elements, wherein $0.8 \leq X \leq 1.3$, $0.1 \leq Y \leq 0.3$, $0.1 \leq Z \leq 1.0$ and $0.3 \leq W \leq 0.8$.

2. A magneto-optical element according to claim 1, wherein $0.8 \leq X \leq 1.3$, $0.1 \leq Y \leq 0.2$, $0.1 \leq Z \leq 0.9$ and $0.3 \leq W \leq 0.8$.

3. A magneto-optical element according to claim 1, wherein
$X = 1.3$,
$Y = 0.1$,
$Z = 0.1$
and $0.5 \leq W \leq 0.8$.

4. A magneto-optical element according to claim 1, wherein the crystal has a composition of $(Bi_{1.3}Gd_{0.1}R_{0.1}Y_{1.5})(Fe_{4.4}Ga_{0.6})O_{12}$.

5. A magneto-optical element according to claim 1, wherein said element R is lanthanum.

6. A magneto-optical element according to claim 1, wherein said crystal is a single crystal.

7. A magneto-optical element according to claim 1, wherein said crystal is polycrystalline or a sintered material.

8. A magneto-optical element according to claim 1, wherein said crystal is grown epitaxially on a single crystal garnet substrate.

9. A magneto-optical element according to claim 8, wherein said garnet crystal substrate is a Ca—Mg—Zr substituted $Gd_3Ga_5O_{12}$ substrate or a $Nd_3Gd_5O_{12}$ substrate.

10. A magnetic field measurement instrument, comprising:
a magneto-optical transducer including a polarizer, an analyzer and a magneto-optical element placed between the polarizer and the analyzer, the magneto-optical element being made of a bismuth-substitution rare earth iron garnet crystal of a chemical formula $$(Bi_XGd_YR_ZY_{3-X-Y-Z})(Fe_{5-W}Ga_W)O_{12},$$

wherein R designates an element selected among rare earth
elements, wherein $0.8 \leq X \leq 1.3,$ $0.1 \leq Y \leq 0.3,$ $0.1 \leq Z \leq 1.0$ and $0.3 \leq W \leq 0.8,$ the analyzer being provided so as to make the direction of transmitted light through the magneto-optical element different from that of the polarizer;
a first optical transmission line connected via the polarizer at an end of the magneto-optical element of the magneto-optical transducer;
a light source for generating light to the first optical transmission line;
a second optical transmission line connected via the analyzer at the other end of the magneto-optical element of the magneto-optical transducer;
an optical sensor for detecting an optical output from the second optical transmission line to convert to an electrical signal; and
a signal processor for processing an electrical output signal from the optical sensor;
wherein a magnetic field is measured by placing the magneto-optical converter in a magnetic field and by detecting a change in intensity of output light with the signal processor when the incident light transmits the magneto-optical transducer.

11. A magnetic field measurement apparatus according to claim 10, wherein said light source generates a light having a peak wavelength between 0.78 and 0.90 μm.

* * * * *